United States Patent [19]
Dooley

[11] Patent Number: 5,311,070
[45] Date of Patent: May 10, 1994

[54] SEU-IMMUNE LATCH FOR GATE ARRAY, STANDARD CELL, AND OTHER ASIC APPLICATIONS

[75] Inventor: Jerry G. Dooley, Melbourne, Fla.

[73] Assignee: Harris Corporation, Melbourne, Fla.

[21] Appl. No.: 905,015

[22] Filed: Jun. 26, 1992

[51] Int. Cl.[5] .................. H03K 3/26; H03K 3/284; H03K 3/42; H03K 17/687

[52] U.S. Cl. .................. 307/279; 307/272.1; 307/311; 307/451; 307/585

[58] Field of Search .............. 307/279, 290, 291, 292, 307/272.1, 272.2, 571, 573, 576, 579, 585, 451; 365/3, 190

[56] References Cited

U.S. PATENT DOCUMENTS

| | | | |
|---|---|---|---|
| 4,782,467 | 11/1988 | Belt et al. | 365/190 |
| 4,931,990 | 6/1990 | Perkin | 365/3 |
| 4,970,407 | 11/1990 | Patchen | 307/279 |
| 4,988,893 | 1/1991 | Bonneau et al. | 307/279 |
| 5,039,876 | 8/1991 | Hochwald et al. | 307/272.2 |
| 5,049,760 | 9/1991 | Ooms | 307/279 |
| 5,103,116 | 4/1992 | Sivilotti et al. | 307/279 |
| 5,111,429 | 5/1992 | Whitaker | 365/190 |
| 5,175,605 | 12/1992 | Pavlu et al. | 307/451 |

OTHER PUBLICATIONS

Diehl, S. E., "Error Analysis and Prevention of Cosmic Ion-Induced Soft Errors in Static CMOS RAMS", *IEEE Transactions on Nuclear Science*, vol. NS-29, No. 6, Dec. 1982; pp. 2032-2039.

Hsieh and Murley, "A Field-funneling Effect on the Collection of Alpha-Particle-Generated Carriers in Silicon Devices", *IEEE Electron Device Letters*, vol. EDL-2, No. 4, Apr., 1981, pp. 103-105.

Hu, C., "Alpha-Particle-Induced Field and Enhanced Collection of Carriers", *IEEE Electron Device Letters*, vol. EDL-3, No. 2, Feb. 1982, pp. 31-34.

Diehl, Vinson, Shafer and Mnich, "Considerations for Single Event Immune VLSI Logic", *IEEE Transactions on Nuclear Science*, vol. NS-30, No. 6, Dc. 1983, pp. 4501-4507.

Rockett, Leonard, "An SEU-Hardened CMOS Data Latch Design", *IEEE Transactions of Nuclear Science*, vol. 35, No. 6, Dec., 1988, pp. 1682-1687.

Peterson and Diehl, "Suggested Single Event Upset Figure of Merit", *IEEE Transactions on Nuclear Science*, vol. NS-30, No. 6, Dec., 1983, pp. 4533-4539.

Mnich, Diehl, Shafer, Koga, Kolasinski and Ochoa, "Comparison of Analytical Models and Experimental Results for Single Event Upset in CMOS SRAMs*", *IEEE Transactions on Nuclear Science*, vol. NS-30, No. 6, Dec. 1983, pp. 4620-4623.

Primary Examiner—William L. Sikes
Assistant Examiner—Troug Phan
Attorney, Agent, or Firm—Charles Wands

[57] ABSTRACT

A single event upset immune latch circuit comprises a first latch having first and second complementary channel inverters respective input nodes and output nodes of which are cross-coupled to one another. First second pairs of (complementary channel) decoupling transistors respectively couple the output nodes of said first and second complementary channel inverters in circuit with first and second voltage supply terminals. (Cross-)coupled with the first latch is a second latch having third and fourth complementary channel inverters, respective input nodes and output nodes of which are cross-coupled to one another. Third and fourth pairs of (complementary channel) decoupling transistors respectively couple the third and fourth complementary channel inverters in circuit with the first and second voltage supply terminals. Respective input nodes of the first and second latches are mutually (cross-)coupled with the gates of the pairs of complementary channel transistors of the first and second latches, so as to bias the gates of the first and second pairs of complementary channel transistors at voltage levels complementary to the voltage levels stored by the inverters to which they are coupled.

19 Claims, 14 Drawing Sheets

SEU-IMMUNE LATCH FOR GATE ARRAY, STANDARD CELL, AND OTHER ASIC APPLICATIONS

FIELD OF THE INVENTION

The present invention relates in general to integrated circuit architectures and is particularly directed to a latch configuration that is effectively immune to single event upsets.

BACKGROUND OF THE INVENTION

The expanding availability of application specific integrated circuit (ASIC) technology to signal processing system manufacturers, particularly those who design and produce systems for sophisticated applications such as spaceborne communication and defense systems, has resulted in the use of an increasing number of gate array, standard cell, and silicon compiler-based chips in complex and hostile environment programs. Some of these programs, especially those associated with space and military applications, require semiconductor chips that are hardened against single event upsets (SEU). This hardening applies to processor, random logic, and memory chips, thereby necessitating SEU immune latches and flip flops, as well as memory cells.

One previous proposal to prevent SEU in memory cells, described in an article by S. E. Diehl et al, entitled "Error Analysis and Prevention of Cosmic Ion-Induced Soft Errors in Static CMOS RAMs," IEEE Trans. Nuclear Science, Vol. NS-29, p 2032, December 1982, has been to employ special processing techniques, such as those which incorporate high sheet resistance cross-coupled poly resistors as part of the circuit architecture. To understand the effect of resistors on SEU, consider the unstabilized, cross-coupled CMOS inverter pair, diagrammatically illustrated at 11, 13 in FIG. 1, the inverter pair serving as the storage element in a memory. Sensitive areas of the memory are the drain regions of the complementary devices (the reverse biased junctions of "off" devices).

When an ion passes through silicon, it produces a track of electron-hole pairs. If the ion passes through a sensitive region, the electron-hole pairs along the track will be separated by the field of the reverse biased junction, resulting in an immediate current response that deposits charge on the node. This drift-current-driven, charge collection process can be enhanced by diffusion and the field funnelling effect, as described in articles by C. M. Hsiech et al, entitled "A Field-Funneling Effect on the Collection of Alpha Particle-Generated Carriers in Silicon Devices," IEEE Electron Device Letters, Vol. EDL-2 No. 4, p. 103, April 1982, and by C. Hu, entitled "Alpha Particle-Induced and Enhanced Collection of Carriers," IEEE Electron Device Letters, Vol. EDL-3 No. 2, p. 31, February 1982.

In the memory circuit of FIG. 1, consider the case of an ion hitting the reverse biased drain 21D of P-type transistor 21 of a CMOS inverter 11, the input and output nodes of which are cross-coupled with those of a CMOS inverter 13. Such a "hit" creates a current pulse (diagrammatically illustrated as a current source I1) which pulls output node 15 of inverter 11 high to very near Vdd. When this happens, two things can occur. First, after the current at node 15 subsides, the voltage on the node can recover to its original value. The time required for node 15 to recover is referred to as the recovery time tR. It should be noted that the recovery time tR depends on the charge deposited (length and amplitude of the current pulse) and the current drive capability of N-type transistor 22 of CMOS inverter pair 11, to which the drain of P-type transistor 21 is connected. Secondly, when the voltage at node 15 is pulled high, node 16 of the other CMOS inverter 13 can begin to fall, thereby providing the feedback for upset.

In summary, a hit at the drain 21D of transistor 21 causes nodes 15 and 16 to be at the same voltage level ($V_{DD}$) for a short period of time. Upset will not occur if the recovery time tR is less than the inverter falling propagation delay tdf (tR < tdf). A similar analysis can be conducted for the case of a "hit" at the off drain 32D of N-type transistor 32, to which the drain of P-type transistor 31 of inverter pair 1 is connected.

By inserting resistors in the feedback paths of the inverter pairs, as diagrammatically illustrated at 41, 42 in FIG. 2, the value of falling propagation delay tdf is increased, so that it is always greater than tR. In a sense, resistors 41, 42 degrade the inherent regenerative feedback mechanism, thereby decoupling storage nodes 15, 16 from one another. This technique has proven effective in eliminating SEU and is used extensively throughout industry. However, the technique is not without its drawbacks. Extra processing steps are required to fabricate the resistors which increases turn time and cost. The resistors are implemented with lightly doped polysilicon and therefore have a large negative temperature coefficient. In order to insure SEU immunity at higher temperatures, very large room temperature resistors are required. Such large resistors substantially increase write times.

In a static random access memory (SRAM), the read operation is accomplished differentially, so that the resistors do not affect read times. The resistor hardening approach is most applicable to those systems requiring fast read times, but in which the write time is not critical. The value of resistance for SEU immunity is usually between 100K-1M requiring very lightly doped polysilicon. Process control of resistors implemented with lightly doped polysilicon is a considerable problem since the resistivity of lightly doped poly varies dramatically with small changes in doping.

The resistor hardening approach to stabilize latches and flip flops is described in an article by S. E. Diehl et al entitled "Considerations for Single Event Immune VLSI Logic," IEEE Trans. Nuclear Science, Vol. NS-30, p. 4501, December 1983, and FIG. 3 shows an example of a conventional CMOS clocked latch 51 comprising cross-coupled CMOS inverter pairs 11-13 stabilized with cross-coupling resistors 61, 63. A clocked complementary CMOS transistor pair 34 is coupled in circuit with inverter 13 and a clocked complementary CMOS transistor pair 36 is coupled in circuit with in input inverter 18 to which an input data terminal D is supplied. The Q output of the latch is derived from an output inverter 19.

Unfortunately, not only does the latch of FIG. 3, that has been stabilized with resistors, suffer from the same problems as the memory cell illustrated in FIG. 2, but, in addition, its write time is significantly increased. In the case of a latch or a flip-flop, long write times are unacceptable. In a synchronous environment, since the signal applied to the latch or flip-flop will be a clock signal, the time required to write into the latch will, in part, establish the clock frequency of the clocking regime. Substantial clock speed degradation due to resistor stabilization is unacceptable in high speed applications.

Because of the above drawbacks of the resistor stabilization approach, considerable attention has recently been focussed on silicon-on-insulator (SOI) technology as a means of reducing SEU susceptibility. Most radiation-hardened CMOS ASIC foundries are bulk processes. Implementation of either of the above-described solutions would result in one or more of the following: increased process complexity, reduced turn time, lower yield, higher cost and/or reduced performance. An SEU immune latch that could be implemented in any CMOS process without requiring technology, process or ground rule changes, and that possesses similar performance to a standard latch, would therefore be highly desirable for ASIC applications.

SOI offers inherent SEU resistance, no possibility of latchup and gamma dot upset/survivability levels that are 5-10× those of bulk. The inherent SEU resistance of SOI comes from the reduction in the charge collection depth of a potential ion strike. However, the reduction in charge collection depth often does not increase SEU resistance sufficiently to meet bit error rate (BER) requirements of high speed signalling applications. Other techniques such as custom layout to reduce strike areas, the addition of capacitors on sensitive nodes to increase the critical charge for upset, or the use of poly resistors in feedback paths must also be utilized. Thus, along with its merits, SOI also has some potential drawbacks.

For a number of reasons SOI yields are lower than those of similar bulk technologies. Also, very thin epitaxial layers are required to obtain the SEU immunity levels required by today's strategic systems. Obtaining high quality, thin epi-on-insulator has proven difficult, causing SOI starting wafers to be much more expensive than bulk wafers. These two factors make the cost of SOI parts much higher than bulk. SOI devices can also potentially have back-channel leakage problems and therefore may not provide as good a total dose hardness as an equivalent bulk technology. For applications requiring total dose and SEU hardness but not gamma dot, and in which recurring cost is a concern, SEU-hardened bulk technology may provide a viable alternative to SOI.

SUMMARY OF THE INVENTION

In accordance with the present invention there is provided an SEU-hardened latch design that maintains fast write times while requiring no process, technology or ground rule changes. Whereas the previously described resistor approach relies on high value polysilicon resistors to degrade the regenerative feedback mechanism, the present invention uses off n-channel and p-channel devices to decouple the two storage nodes of the cross-coupled inverter pair.

More particularly, the SEU-hardened latch in accordance with the present invention comprises a first latch circuit having first and second complementary channel inverters, respective input nodes and output nodes of which are cross-coupled to one another. First second pairs of decoupling transistors, such as complementary channel decoupling transistors, are respectively coupled in circuit with output nodes of the first and second complementary channel inverters and first and second voltage supply terminals. Cross-coupled with the first latch is a second, duplicate latch circuit having third and fourth complementary channel inverters, respective input nodes and output nodes of which are cross-coupled to one another. Third and fourth pairs of (complementary channel) decoupling transistors are respectively coupled in circuit with output nodes of the third and fourth complementary channel inverters and the first and second voltage supply terminals. Respective input nodes of the first and second latches are selectively coupled with the gates of the pairs of decoupling transistors of the first and second latch circuits, so as to bias the gates of the first and second pairs of decoupling channel transistors at prescribed control voltage levels, such as those complementary to the voltage levels stored by the inverters to which they are coupled.

DETAILED DESCRIPTION

Figure 4:
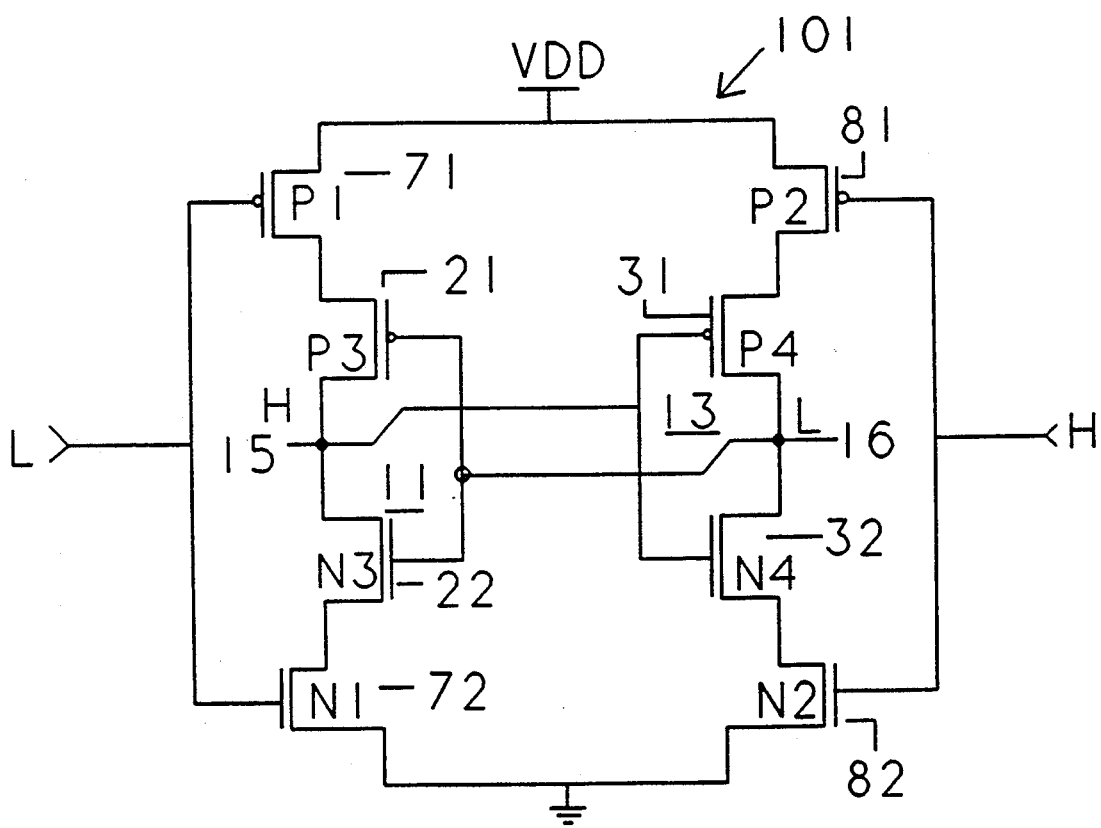
FIG. 4 diagrammatically illustrates an SEU immune latch in accordance with an embodiment of the present invention.

FIG. 4 diagrammatically illustrates an SEU immune latch 101 in accordance with an embodiment of the present invention, in which respective "off" p-channel transistors 71, 81 and n-channel transistors 72, 82 are coupled in circuit with the source-drain paths to the supply terminals ($V_{DD}$, GND) of cross-coupled inverters 11, 13 and serve to decouple the two storage nodes 15 and 16 from the respective supply rails. For the latched state shown, where node 15 is at a high voltage level and node 16 is at a low voltage level, the gate bias to p-channel decoupling transistor 71 and n-channel decoupling transistor 72 is a low voltage level $V_L$, and the gate bias to p-channel decoupling transistor 81 and n-channel decoupling transistor 82 is a high voltage level $V_H$. In order to store opposite data, the bias applied to decoupling devices 71, 81, 72, 82 must be inverted, as will be described below.

Consider now the case of an ion strike or "hit" at the drain of transistor 22 (node 15), which causes node 15 to discharge to very near Vss (here GND). With node 15 at a low voltage level $V_L$, p-channel transistor 31 turns on and n-channel transistor 32 turns off. However, the voltage on node 16 will remain at a low level $V_L$ because decoupling p-channel transistor 81 is off due to the $V_H$ bias at its gate, thereby blocking the pull-up path to the $V_{DD}$ supply rail. Since node 16 remains at a low level, when the single-event-induced current at node 15 subsides, node 15 will recover to $V_{DD}$ through p-channel decoupling transistor 71 and p-channel transistor 21.

Figure 5:
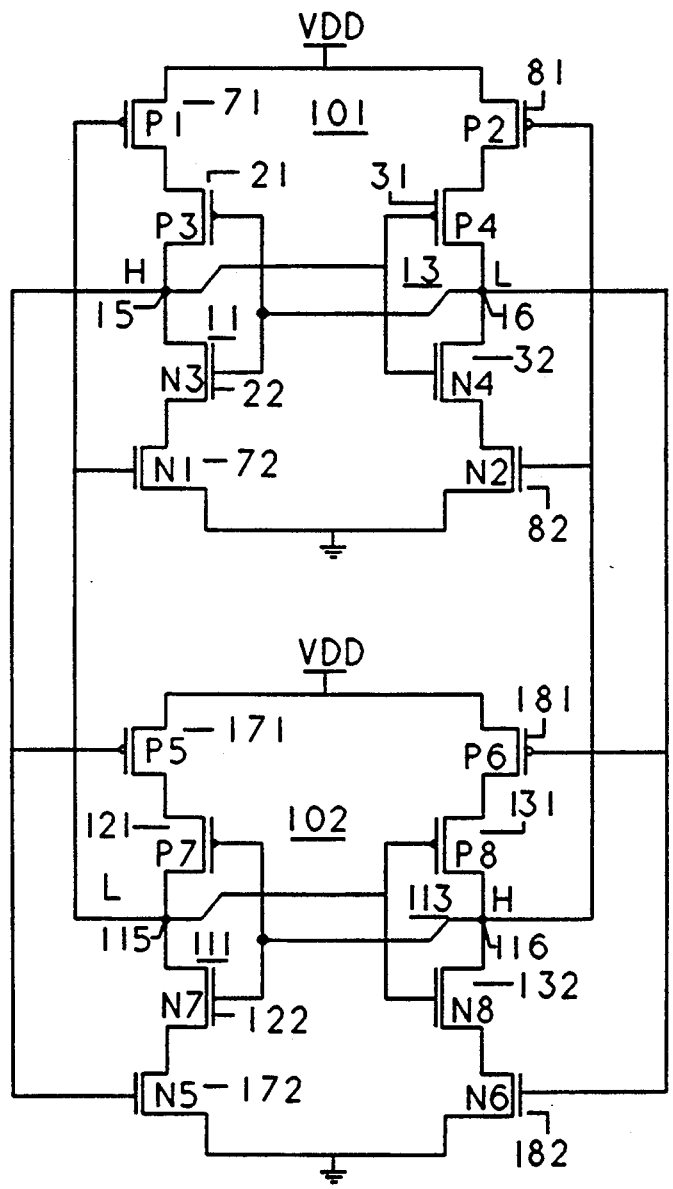
FIG. 5 diagrammatically illustrates the SEU immune latch of FIG. 4, together with a duplicate latch with node cross-coupled gate biasing of the decoupling transistors.

Up to this point, it has been shown how the two storage nodes 15 and 16 of latch 101 are decoupled from the supply rails by pairs of complementary decoupling transistors 71, 72 and 81, 82 with the proper applied bias at their gates. This gate bias may be established by cross-coupling inputs and decoupling gate bias nodes of a duplicate latch 102, as shown in FIG. 5. In the dual latch configuration of FIG. 5, there are four potentially sensitive nodes 15, 16, 115, 116. However, an ion strike at any one node does not disturb the voltage on any of the others, thereby allowing the impacted node to recover to its original value. SEU immunity is achieved using off n-channel and p-channel decoupling transistors which break the feedback loop when a node is hit. In the dual latch configuration of FIG. 5, data is latched in a low impedance state at each of the four storage nodes 15, 16, 115, 116. A hit at one node causes two of the other three nodes to temporarily become high impedance; however, the decoupling transistors insure that the charge, and therefore the voltage, on these nodes is not disturbed. Upon termination of the (ion strike) event, the impacted node recovers, and all storage nodes will return to their original low impedance state.

More particularly, for purposes of providing an illustrative example, again consider the case of an ion strike at node 15 of latch 101. A hit at node 15 causes p-channel inverter transistor 31 of latch 101 and p-channel decoupling transistor 171 of duplicate latch 102 to turn on. However, neither feedback path can be completed because p-channel inverter transistor 121 of duplicate latch 102 and p-channel decoupling transistor 81 remain off, thereby opening the path to the $V_{DD}$ supply rail. The voltage level at node 15 returns to $V_{DD}$ through p-channel decoupling transistor 71 and p-channel inverter transistor 21 after charge collection resulting from the hit terminates. A similar analysis can be made for ion strikes at the other storage nodes.

The basic SEU-immune dual latch cell illustrated in FIG. 5 offers several advantages over other techniques. First, with its "off-device decoupling" mechanism, the circuit achieves total SEU immunity solely by virtue of its circuit configuration. No technology, process, or ground rule changes, or even circuit design considerations are necessary. This characteristic is of particular importance to gate array and other ASIC approaches where the implementation of other solutions may be too costly, time consuming, unreliable or technically infeasible.

Secondly, the notion of critical charge is meaningless when applied to this latch configuration. No value of critical charge deposited on a node will cause the cell to upset. Therefore, SEU-immunity is independent of the size and energy of the particle as well as the vertical device structure of the process.

A third aspect of the latch cell is the fact that SEU immunity is not established by recovery or delay times. This means that, with regard to SEU immunity, device current drive capability and device ratios are irrelevant. This feature of the present invention is again significant for gate array applications where device size and ratios are somewhat limited. Also, the complex bias, time and dose rate dependence of p- and n-channel device parameters makes the fact that SEU-immunity does not rely on current drive and device ratios—a substantial advantage for total dose radiation environments. For gate array and total dose applications, the SEU-immunity of this cell, regardless of p-channel and n-channel transistor characteristics, is an important advantage over other designs that have been proposed where the cell is allowed to flip, and is then overwritten by meeting certain dc conditions, such as that described in an article by L. R. Rockett entitled "An SEU-Hardened CMOS Data Latch," IEEE Trans. Nuclear Science, Vol. 35, No. 6 p. 1682, December 1988. This characteristic is also advantageous in custom design since minimum size devices may be used.

Figure 1:
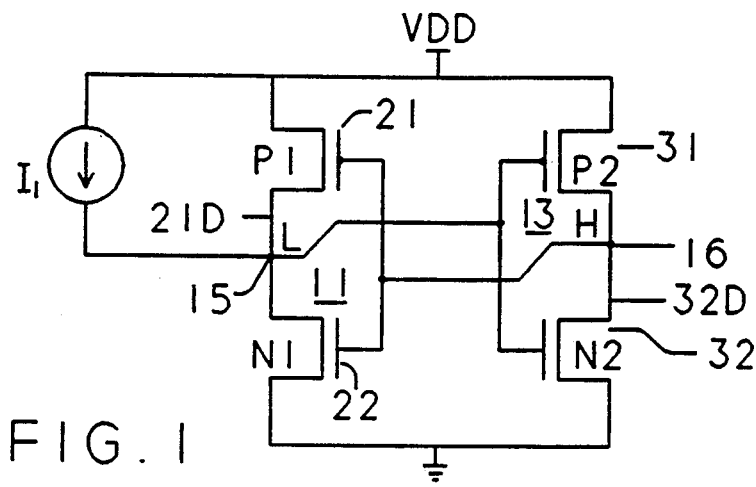
FIG. 1 diagrammatically illustrates an unstabilized cross-coupled CMOS inverter pair, serving as the storage element in a memory.
Figure 2:
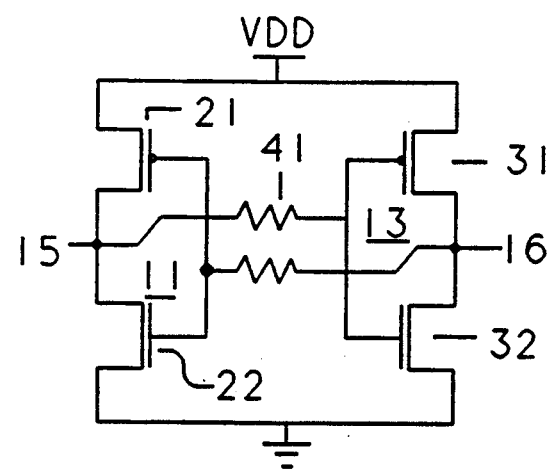
FIG. 2 diagrammatically illustrates the insertion of resistors in the feedback paths of the inverter pairs of the memory circuit of FIG. 1.
Figure 3:
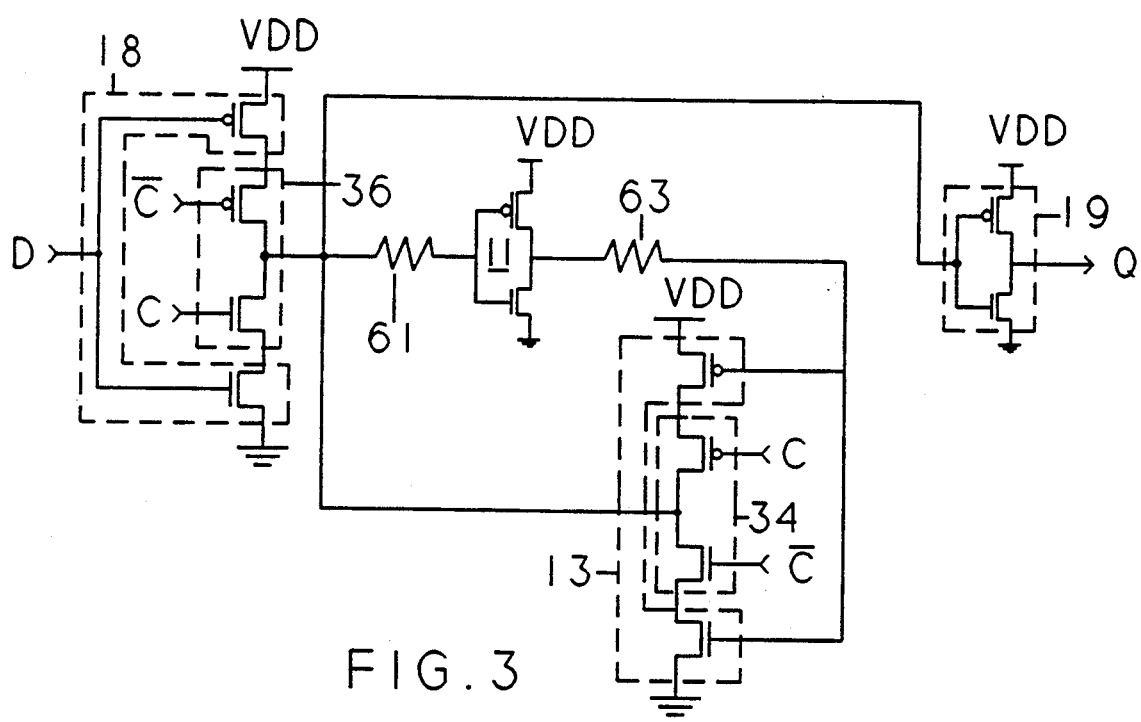
FIG. 3 shows an example of a conventional CMOS latch stabilized with resistors in the inverter cross-coupling paths.

The use of decoupling complementary transistor pairs in accordance with the present invention provides total SEU immunity with significantly less performance degradation than a resistor stabilized latch. More particularly, the performance of a standard latch (e.g. FIG. 1), resistor stabilized latch (FIGS. 2, 3) and an SEU-immune latch that utilizes the off device decoupling complementary pairs of FIGS. 4, 5 has been compared using transistor level circuit simulation application software. Two cases were considered. In the first, it was assumed all three latches were implemented on a 1.2 um rad-hard VHSIC process with custom design and layout. The second case compared the performance of the standard and SEU immune latches when implemented on the same process but in a gate array architecture. The resistor stabilized latch was not included in the second case, since custom poly resistor implementation is not consistent with gate array fabrication or design flow. Performance comparisons were accomplished by simulating the write (data setup) times of each latch over temperature with worst case device parameters and $V_{DD}=4.5V$. The design criteria for the custom case was to optimize latch performance while maintaining the same data input gate capacitance for each latch. This constraint caused the data input device sizes of the new latch to be one half that of the standard latch.

Figure 6:
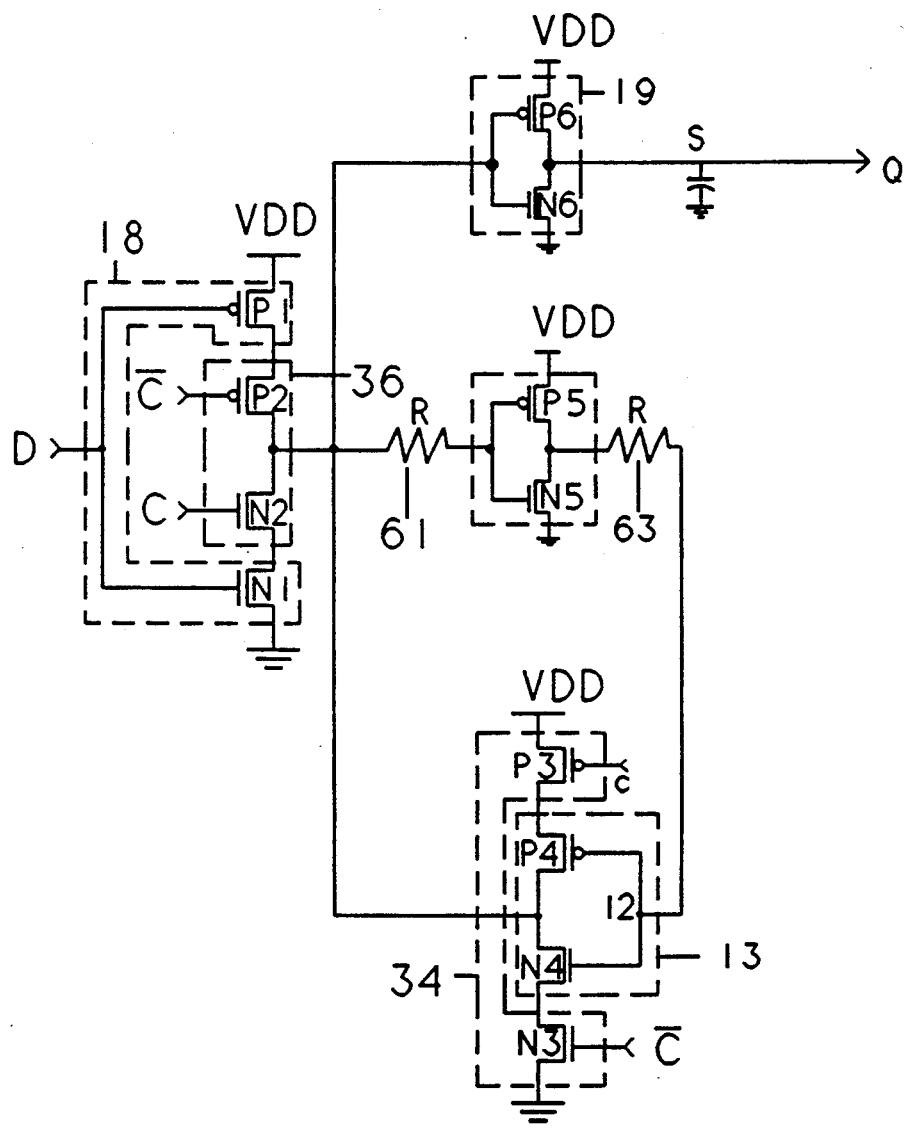
FIGS. 6 and 7 are schematics for embodiments of SEU-immune latches, computer simulation results for which are shown in FIG. 8, in which the data has been normalized to that of a custom, standard latch at 25° C.
Figure 7:
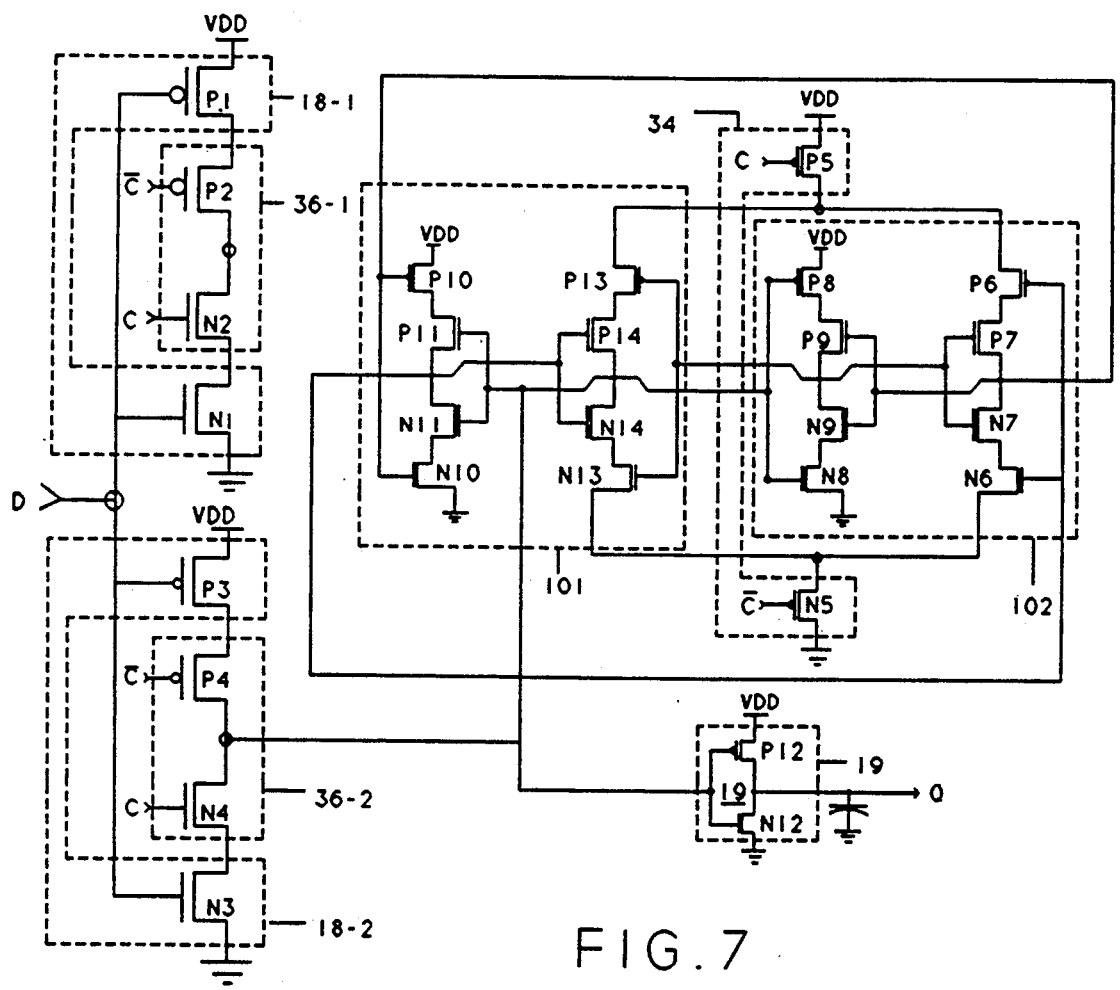

Simulation schematics for the latches are shown in FIGS. 6 and 7. In the circuits shown in FIGS. 6 and 7, as well as those of FIGS. 11, 12 and 13 to be described below, the reference numeral identifications used for the latch shown in FIG. 3 and the dual SEU-immune cross-coupled inverter pair of FIG. 5 have been maintained for consistency. The input inverters 18-1 and 18-2 and corresponding clocked CMOS pairs 36-1 and 36-2 are respectively associated with the respective latches 101 and 102. The version of an SEU-immune latch analyzed here is similar to a standard latch in that no dc conditions must be satisfied for a write.

Figure 8:
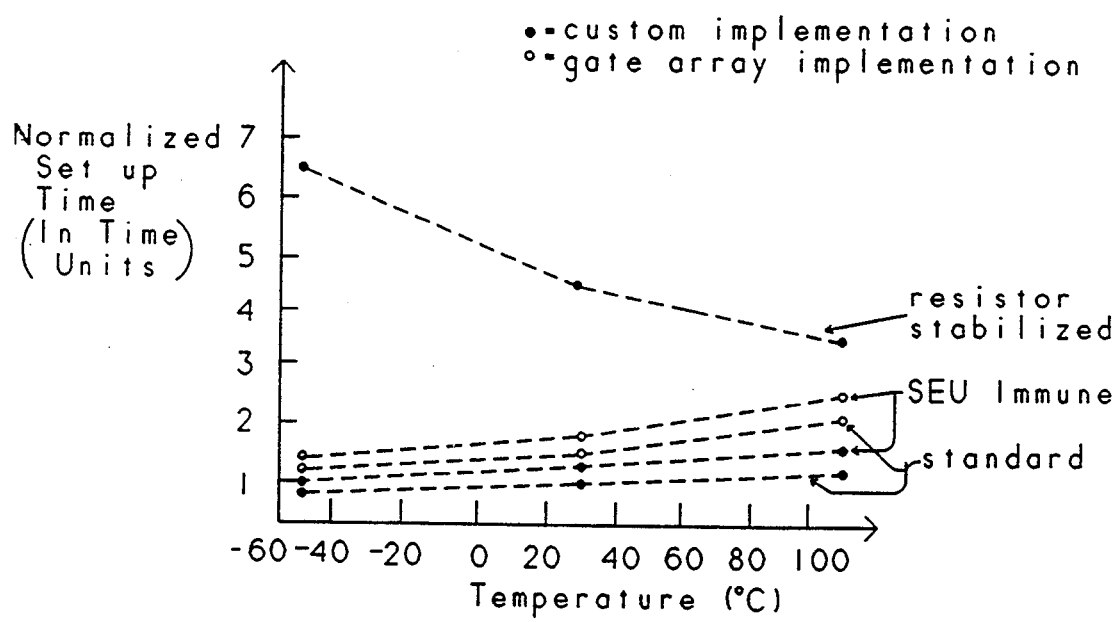

Simulation results for both cases are shown in FIG. 8, in which the data has been normalized to that of the custom, standard latch at 25° C. As can be seen from the illustrated graph, SEU-immune latch write speed is close to that of the standard latch for all temperatures. The small difference in performance can be attributed to the reduced drive of the input devices and the larger capacitance on the internal storage nodes. The input capacitance on the clock line of the new latch is approximately 1.2× that of the standard latch. If 100 percent of standard latches on a chip are replaced with the new hardened design of the present invention, then that fraction of the total dynamic chip power determined by the latch clock input capacitance will increase by 1.2×.

Figure 9:
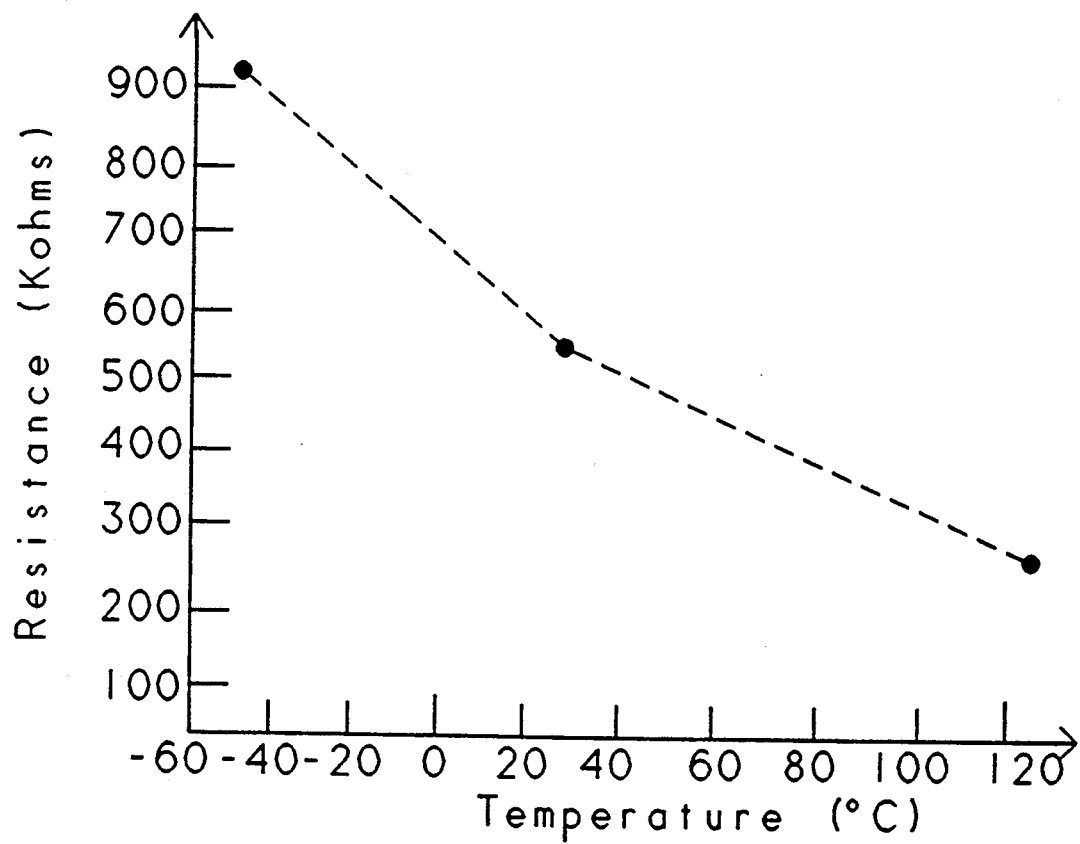
FIG. 9 shows a plot of the resistor characteristic used in an analysis of a resistor-stabilized latch, which displays an unacceptable speed degradation for critical paths at 125° C.

A resistor-stabilized latch displays an unacceptable speed degradation for critical paths at 125° C., and this degradation becomes worse as temperature decreases. This temperature effect may be attributed to the large negative temperature dependency of polysilicon resistors. A plot of the resistor characteristic used in this analysis is shown in FIG. 9. The resistor temperature dependency was estimated from data from a production RAM process. The resistor value was chosen by performing a critical charge simulation at 125° C., $V_{DD}=4.5$ V and worst case parameters. The analysis to determine resistor value must be carried out for 125° C. because of the resistor's negative temperature dependency. The simulated critical charge that must be deposited for upset to occur is plotted as a function of resistor value in FIG. 10.

Table I gives the linear charge deposition (LCD) and latent energy transfer (LET) of a particle that deposits Qcrit for a given resistor value.

TABLE I

| R (K ohms) | Qcrit (pc) (errors/bit/day) | LCD (pc/um) | LET (Mev cm**2/mg) | BER |
|---|---|---|---|---|
| 0 | 0.7 | 0.3 | 29 | 6.5e-7 |
| 50 | 0.95 | 0.41 | 40 | 3.5e-7 |
| 100 | 2.6 | 1.13 | 109 | 4.7e-8 |
| 150 | 8.2 | 3.6 | 348 | 4.8e-9 |

These values were calculated using Qcrit along with the path length over which charge is collected. The collection path length was estimated from previous SEU test results on a 1K×1 register file. Table I includes bit error rate (BER) calculations based on Qcrit, cell geometry and an approximation derived from an article by E. L. Petersen et al entitled "Suggested Single Event Figure of Merit," IEEE Trans. Nuclear Science, Vol. NS-30, No. 6, p. 4533, December 1983. The data in Table I indicates that a resistor value of 100K would be sufficient to harden the latch against particles with LCDs of 1 pC/um (approximately 100 MeV cm**2/mg) or less. However, care must be taken in using this analysis to choose resistor values.

Figure 10:
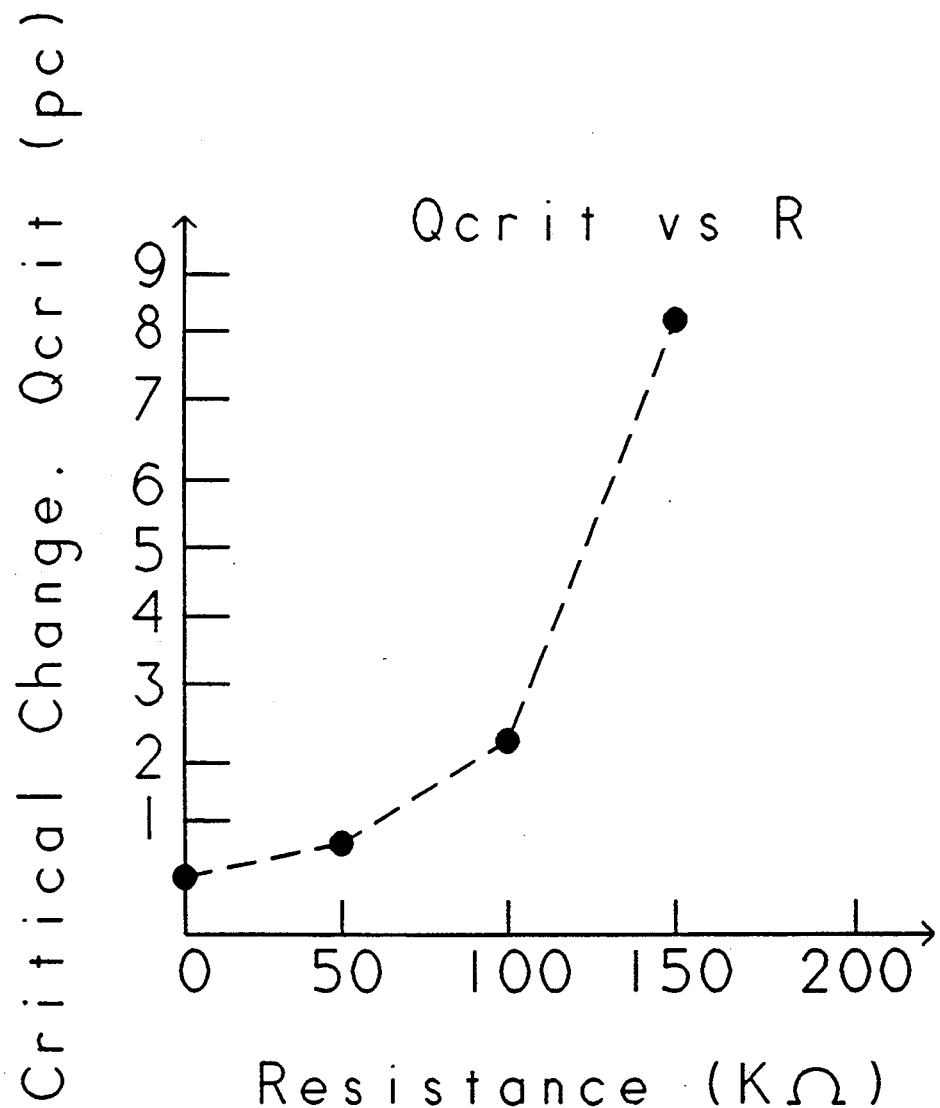
FIG. 10 is a plot of the amount of simulated critical charge that must be deposited for an upset to occur as a function of resistor value.

The SEU model used to determine Qcrit suffers from the same shortcomings identified an article by T. M. Mnich et al entitled "Comparison of Analytical Models and Experimental Results for Single Event Upset in CMOS SRAMS," IEEE Trans. Nuclear Science, Vol. NS-30, No. 6, p. 46203, December 1983, in that charge could be lost through the forward biasing of the drain-to-substrate diode in the computer simulation. This effect may result in an underestimation of feedback resistor value as well as the sharp increase in Qcrit with resistance, as seen in FIG. 10. Also, the 3 sigma resistance value cap can be 50 percent of the mean. Thus, in order to guarantee a minimum value of R, the resistance value must typically be 2× the minimum. Considering the potential inaccuracy of the Qcrit model along with the large 3 sigma resistance spread, a 125° C. resistor value of 250K is not an unrealistic choice to harden the latch against particles with LCDs up to 1 pC/um.

The graphical data in FIG. 8 indicates that an SEU-immune latch in accordance with the present invention is capable of providing performance similar to that of a standard CMOS latch when both are implemented in a gate array architecture. Like the custom case, there is a small difference in write time of the two gate array implementation, since the SEU-immune latch has an inherently larger capacitance on its internal nodes than the standard latch.

Even though a gate array implementation of the inventive latch provides SEU immunity with very near equivalent speed performance of a standard latch, the SEU-immune latch possesses some minor drawbacks. Because the device sizes of the gate array are fixed, the SEU latch data input capacitance is 2× that of a standard latch. Also, the clock input capacitance is 2.3× that of the standard latch. This increase in capacitance implies that the fraction of chip dynamic power determined by latch input capacitance will increase by 2.3× if all standard latches are replaced by SEU immune latches. Perhaps, the most limiting characteristic of the inventive latch is the number of devices required compared to that of the standard latch (28 compared to 12). In a gate array, cell height is a constant while cell width is directly proportional to the number of devices. This gate array configuration of the SEU-immune latch therefore consumes approximately 2.5× the amount of semiconductor real estate of a standard latch. In some cases, the area penalty of the latch may have to be considered versus that associated with implementing error detection and correction. Other cases may require only a few latches performing critical functions to be SEU-hardened, in which case the area penalty of the SEU latch may be tolerable.

Figure 11:
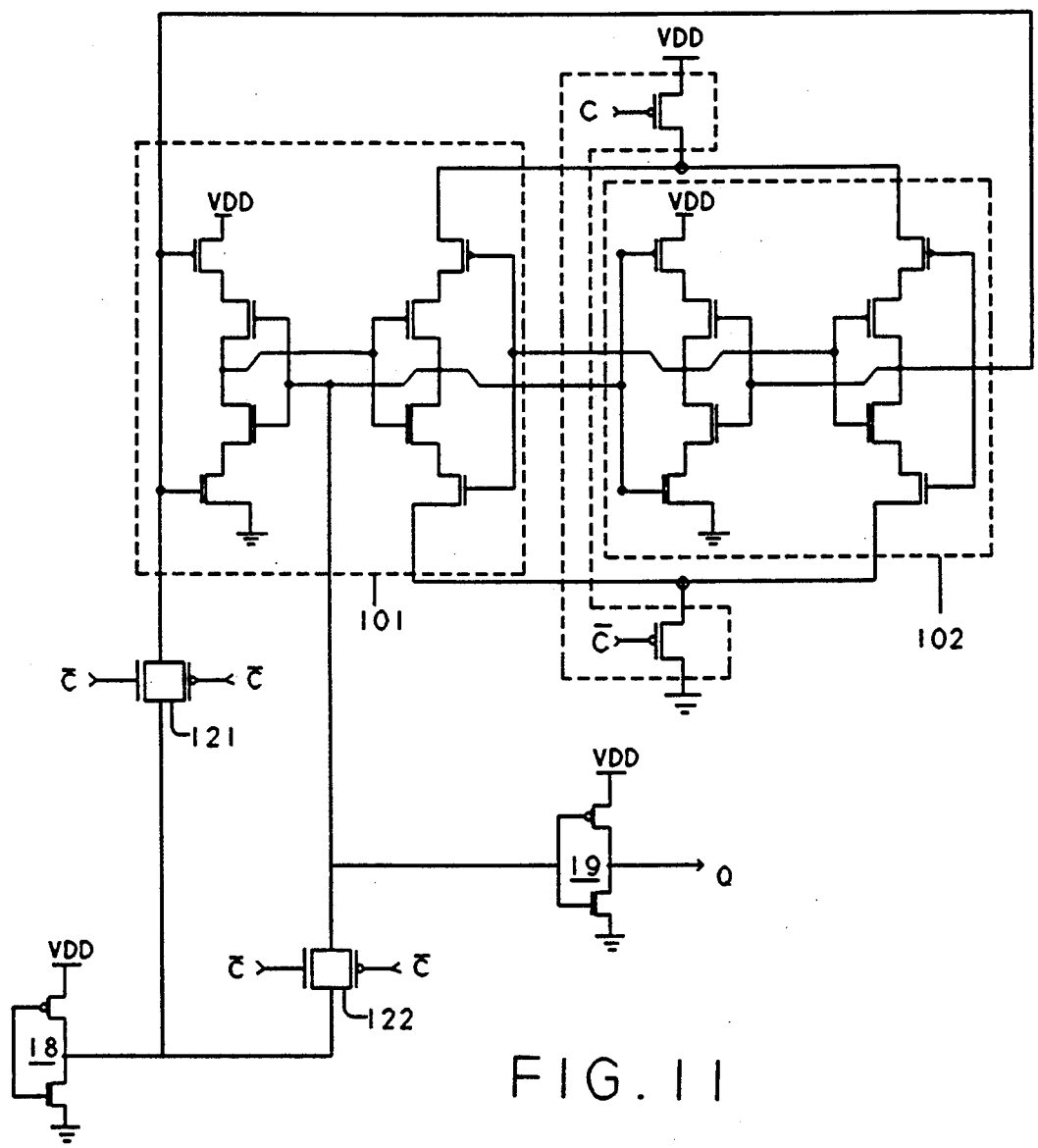
FIG. 11 is a schematic illustration of an SEU-immune latch configuration using the decoupling mechanism of the present invention for a modification of the circuit configuration of FIG. 7 with transmission gates are used instead of clocked inverters.
Figure 12:
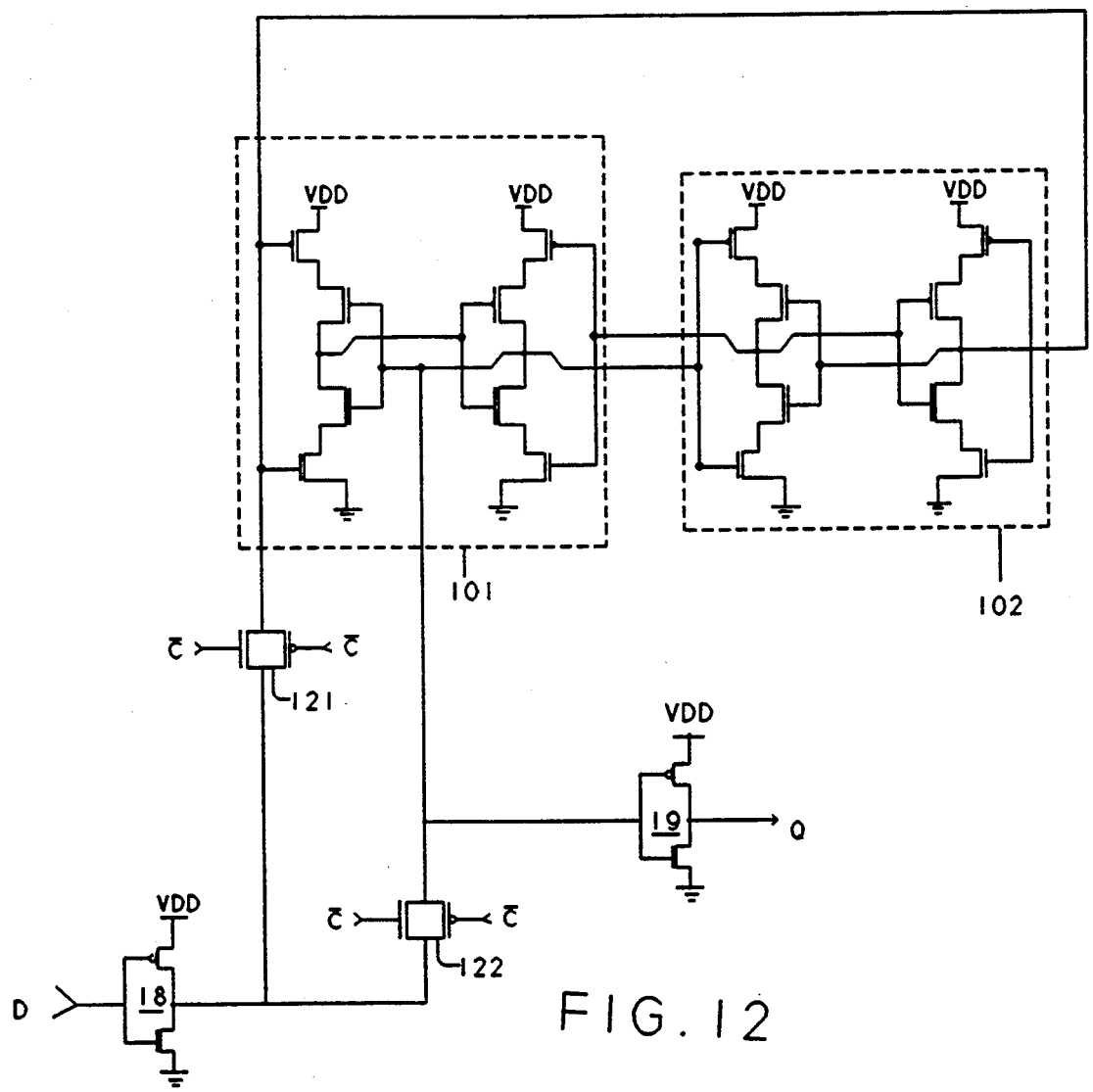
FIG. 12 is a schematic illustration of an SEU-immune latch configuration using the decoupling mechanism of the present invention for a modification of the circuit configuration of FIG. 7 with tri-state devices removed.
Figure 13:
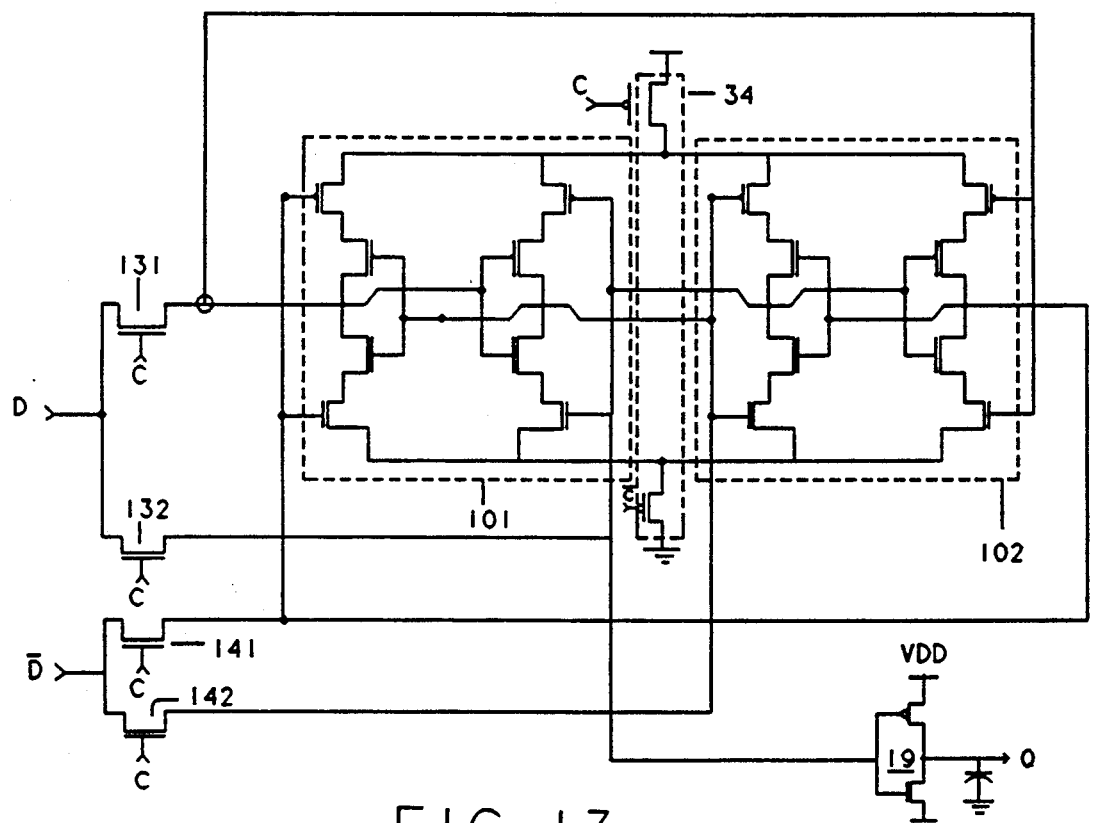
FIG. 13 shows another variation of the SEU-immune latch in accordance with the present invention which uses n-channel pass transistors to write into the basic cell.

FIGS. 11, 12 and 13 are schematic illustrations of other SEU immune latch configurations using the decoupling mechanism of the present invention, described in detail above with reference to FIGS. 4 and 5. In order to avoid cluttering of the drawings, the reference numerals of the individual devices and nodes of the SEU immune latches 101, 102 have been omitted. The circuit configuration of FIG. 11 is very similar to that shown in FIG. 7, except that transmission gates 121, 122 are used instead of the clocked CMOS pairs associated with the input inverter 18, which has the effect of reducing the device count from 28 to 26.

The circuit configuration of FIG. 12 is also similar to that of FIG. 7, except that the tri-state devices have been removed, which effectively reduces the device count from 28 to 24. This circuit configuration ensures that SEU-immunity is independent of device size, ratios or saturation currents. However, device ratios and saturation currents must be considered in this design since cell write depends on satisfying certain dc conditions.

FIG. 13 shows another variation of the SEU-immune latch in accordance with the present invention which uses n-channel pass transistors 131, 132 (for the non-inverter D input) and 141, 142 (for the inverted D-NOT input) to write into the basic cell. The configuration of FIG. 13 has a device (FET) count of 24 and no dc write conditions.

Figure 14:
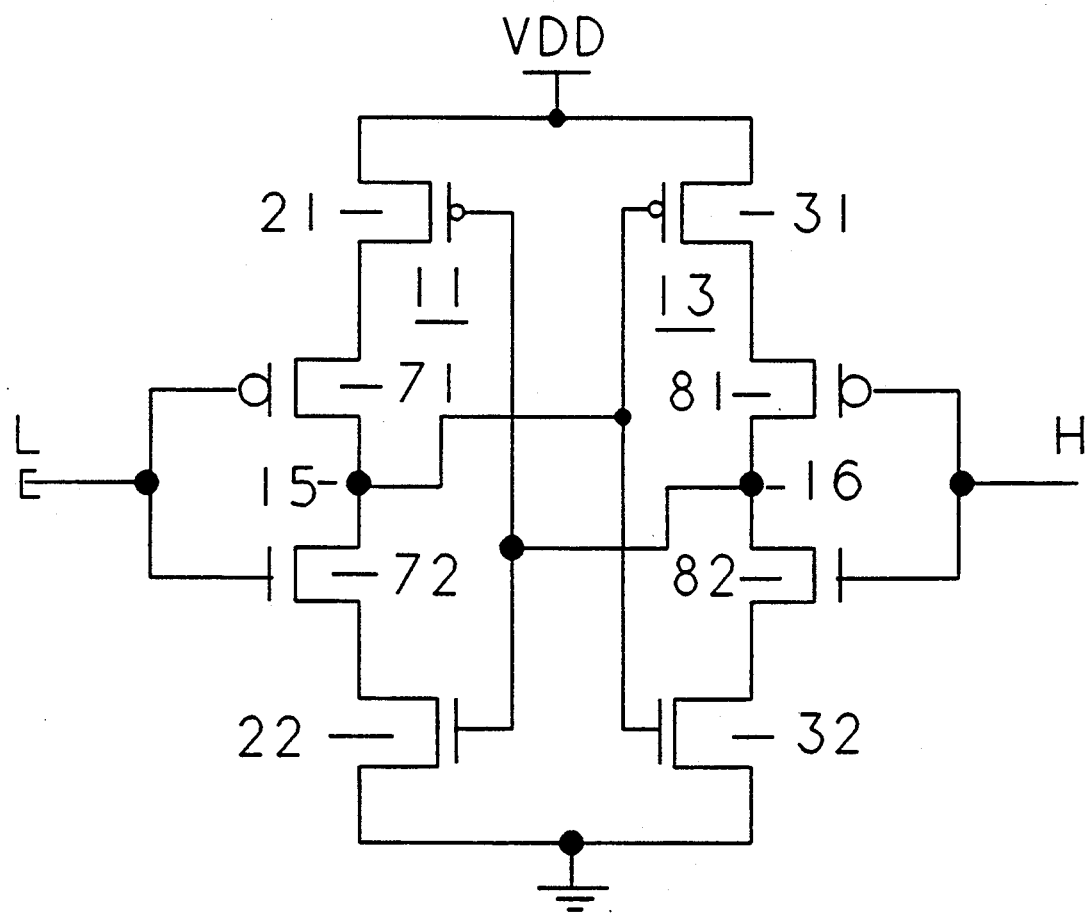
FIGS. 14 and 15 diagrammatically illustrate modifications of the circuit configurations of FIGS. 4 and 5, respectively, in which in the circuit path locations of the inverter transistors and the decoupling transistors may be reversed with respect to their locations shown in FIGS. 4 and 5.
Figure 15:
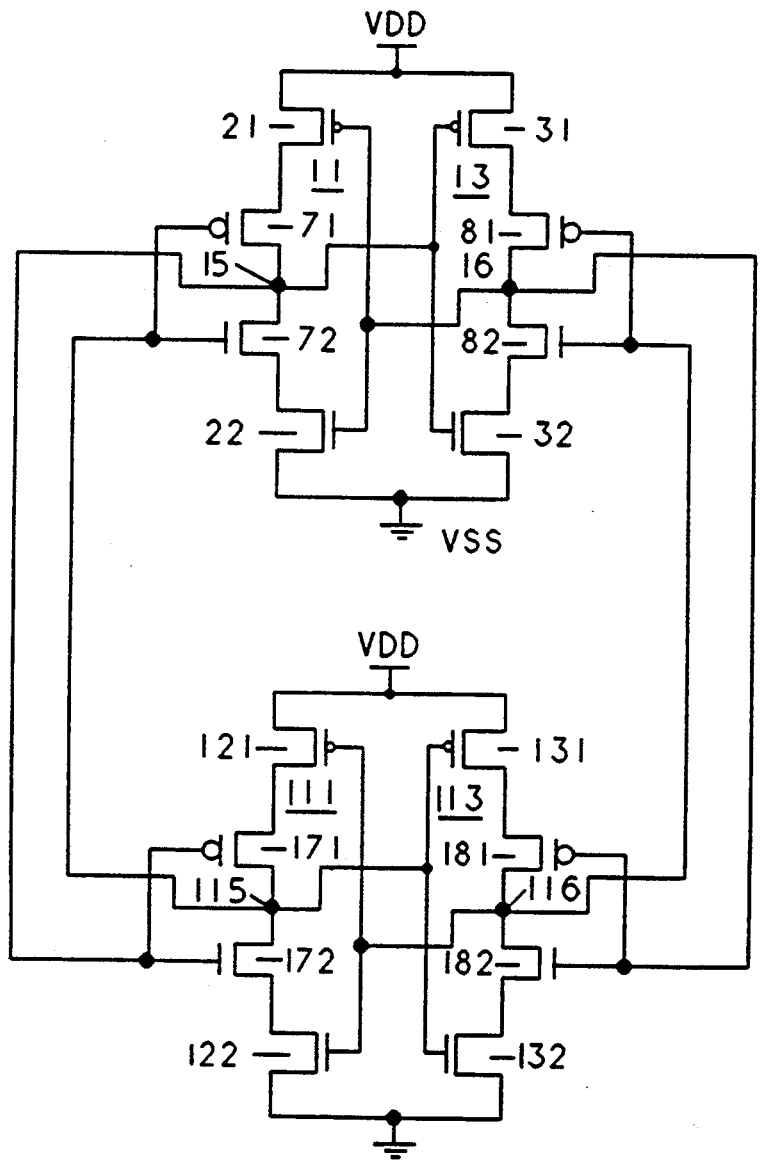

It will be understood that the alternative circuits of FIGS. 11, 12 and 13 are only a few of many possible SEU immune latch implementations using the basic cell configuration of FIG. 5. The best choice will depend on the particular process characteristics and design environment. Moreover, the single SEU immune latch configuration and the double SEU immune latch configuration are not limited to insertion of the node/supply rail decoupling transistors between the inverter pairs and the supply rails or the specific channel conductivity types illustrated in FIGS. 4 and 5. For example, as diagrammatically illustrated in FIGS. 14 and 15, the circuit path locations of the inverter transistors and the decoupling transistors may be reversed with respect to their locations shown in FIGS. 4 and 5, respectively. In addition, the conductivity types of the decoupling transistors may be changed, with a corresponding change in the bias connections to their gates. As one non-limitative example, in the embodiment of FIG. 5, if the conductivity types of each of decoupling transistors 71, 72, 81, 82 are reversed, the gates of transistor pair 71, 72 would be coupled to node 116 of latch 102, while the gates of transistor pair 81, 82 would be connected to node 115 of latch 102. As another non-limitative example, considering the same circuit of FIG. 5, if the channel conductivity types of decoupling transistors 71 and 81 are reversed to N-type, instead of the P-type shown, transistors 72, 82 remain N-type, the gates of the latter transistors may remain biased-connected to nodes 115 and 116 of latch 102, as shown, while the gates of transistors 71, 81 may be cross-connected to respective nodes 116 and 115 of latch 102.

As will be appreciated from the foregoing description, the SEU-immune latch in accordance with the present invention achieves SEU immunity solely by means of its circuit configuration and without significant performance degradation over that of a standard latch. SEU-immunity is independent of LET, LET spectra, vertical device structure, CMOS fabrication process, device ratios or current drive. These characteristics make the latch well suited for gate array and other ASIC applications where device sizes and layouts cannot necessarily be customized for SEU immunity.

While I have shown and described several embodiments in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A latch circuit comprising:
   first and second complementary channel transistor inverters having respective input and output thereof cross-coupled to one another; and
   first and second pairs of decoupling transistors respectively coupled in circuit paths containing the output nodes of said first and second complementary channel transistor inverters and first and second voltage supply terminals; and
   wherein decoupling transistors of said first pair of decoupling transistors have control electrodes thereof, connected to a first common control node, and decoupling transistors of said second pair of decoupling transistors have control electrodes thereof connected to a second common control node.

2. A latch circuit according to claim 1, wherein said first and second pairs of decoupling transistors respectively comprise first and second pairs of complementary channel decoupling transistors, and wherein complementary channel decoupling transistors of said first pair of complementary channel decoupling transistors have their gates connected to said first common control node biased at a first voltage level, and complementary decoupling transistors of said second pair of complementary channel decoupling transistors have their gates connected to said second common control node biased at a second voltage level which is complementary to said first voltage level.

3. A latch circuit according to claim 2, wherein the gates of said first and second pairs of complementary channel decoupling transistors are biased at voltage levels complementary to the voltage levels stored by the complementary channel transistor inverters to which they are coupled.

4. A latch circuit comprising:
   first and second complementary channel transistor inverters having respective input and output nodes thereof cross-coupled to one another;
   first and second pairs of decoupling transistors respectively coupled in circuit paths containing the output nodes of said first and second complementary channel transistor inverters and first and second voltage supply terminals; and
   third and fourth complementary channel transistor inverters having respective input and output nodes thereof cross-coupled to one another and to the gates of respective ones of said first and second pairs of complementary channel decoupling transistors and third and fourth pairs of complementary channel decoupling transistors respectively coupled in circuit with output nodes of said third and fourth complementary channel transistor inverters and said first and second voltage supply terminals, and wherein the cross-coupled input and output nodes of said first and second complementary channel transistor inverters are coupled to the gates of selected ones of said third and fourth pairs of complementary channel decoupling transistors.

5. A latch circuit comprising:
   a first latch comprising first and second complementary channel transistor inverters having respective input and output nodes thereof cross-coupled to one another, and first and second pairs of decoupling transistors respectively coupled in circuit paths containing the output nodes of said first and second complementary channel transistor inverters and first and second voltage supply terminals; and
   a second latch comprising third and fourth complementary channel transistor inverters having respective input and output nodes thereof cross-coupled to one another, and third and fourth pairs of decoupling transistors respectively coupled in circuit paths containing said third and fourth complementary channel transistor inverters and said first and second voltage supply terminals; and
   wherein respective input nodes of said first and second latches are selectively coupled with gates of the pairs of decoupling transistors of said second and first latches.

6. A single event upset immune latch circuit comprising:
- a first inverter formed of a first complementary channel transistor pair having a first input node coupled to commonly connected gates thereof and a first output node coupled to commonly connected drains thereof, a second inverter formed of a second complementary channel transistor pair having a second input node coupled to commonly connected gates thereof and a second output node coupled to commonly connected drains thereof, and wherein said first input node is coupled to said second output node and said second input node is coupled to said first output node, a first pair of decoupling transistors respectively connected in circuit with source-drain paths of said first complementary channel transistor pair and first and second voltage supply terminals, and a second pair of decoupling transistors respectively connected in circuit with source-drain paths of said second complementary channel transistor pair and said first and second voltage supply terminals, and wherein first and second complementary channel transistor inverters have respective input and output nodes thereof cross-coupled to one another; and
- first and second pairs of decoupling transistors respectively coupled in circuit paths containing the output nodes of said first and second complementary channel transistor inverters and first and second voltage supply terminals; and
- wherein decoupling transistors of said first pair of decoupling transistors have control electrodes thereof connected to a first common control node, and decoupling transistors of said second pair of decoupling transistors have control electrodes thereof connected to a second common control node.

7. A single event upset immune latch circuit comprising:
- a first inverter formed of a first complementary channel transistor pair having a first input node coupled to commonly connected gates thereof and a first output node coupled to commonly connected drains thereof, a second inverter formed of a second complementary channel transistor pair having a second input node coupled to commonly connected gates thereof and a second output node coupled to commonly connected drains thereof, and wherein said first input node is coupled to said second output node and said second input node is coupled to said first output node, a first pair of decoupling transistors respectively connected in circuit with source-drain paths of said first complementary channel transistor pair and first and second voltage supply terminals, and a second pair of decoupling transistors respectively connected in circuit with source-drain paths of said second complementary channel transistor pair and said first and second voltage supply terminals, and wherein first and second complementary channel transistor inverters have respective input and output nodes thereof cross-coupled to one another; and
- first and second pairs of decoupling transistors respectively coupled in circuit paths containing the output nodes of said first and second complementary channel transistor inverters and first and second voltage supply terminals; and
- wherein decoupling transistors of said first pair of decoupling transistors have control electrodes thereof coupled together, and decoupling transistors of said second pair of decoupling transistors have control electrodes thereof coupled together,
- further including a third inverter formed of a third complementary channel transistor pair having a third input node coupled to commonly connected gates thereof and a third output node coupled to commonly connected drains thereof, a fourth inverter formed of a second complementary channel transistor pair having a fourth input node coupled to commonly connected gates thereof and a fourth output node coupled to commonly connected drains thereof, and wherein said third input node is coupled to said fourth output node and said fourth input node is coupled to said third output node, a third pair of decoupling transistors respectively connected in circuit with source-drain paths of said third complementary channel transistor pair and said first and second voltage supply terminals, and a fourth pair of decoupling transistors respectively connected in circuit with source-drain paths of said fourth complementary channel transistor pair and said first and second voltage supply terminals, and wherein decoupling transistors of said third pair of decoupling transistors have control electrodes thereof coupled together and decoupling transistors of said fourth pair of decoupling transistors have control electrodes thereof coupled together.

8. A single event upset immune latch circuit according to claim 7, wherein the first input node of said first inverter is coupled with commonly connected control electrodes of said fourth pair of decoupling transistors, the second input node of said second inverter is coupled with commonly connected control electrodes of said third pair of decoupling transistors, the third input node of said third inverter is coupled with commonly connected control electrodes of said second pair of decoupling transistors, and the fourth input node of said fourth inverter is coupled with commonly connected control electrodes of said first pair of decoupling transistors.

9. A single event upset immune latch circuit according to claim 8, wherein said first pair of decoupling transistors comprises a first pair of complementary channel decoupling transistors having a p-channel transistor coupled to a p-channel transistor of said first inverter and an n-channel transistor coupled to an n-channel transistor of said first inverter, and wherein said second pair of decoupling transistors comprises a second pair of complementary channel decoupling transistors having a p-channel transistor coupled to a p-channel transistor of said second inverter and an n-channel transistor coupled to an n-channel transistor of said second inverter.

10. A single event upset immune latch circuit according to claim 9, wherein said third pair of decoupling transistors comprises a third pair of complementary channel decoupling transistors having a p-channel transistor coupled to a p-channel transistor of said third inverter and an n-channel transistor coupled to an n-channel transistor of said third inverter, and wherein said fourth pair of decoupling transistors comprises a fourth pair of complementary channel decoupling transistors having a p-channel transistor coupled to a p-channel transistor an n-channel transistor of said fourth inverter.

11. A method of imparting single event upset immunity to a latch circuit that is configured of first and second CMOS inverters having respective input nodes and output nodes thereof cross-coupled to one another, said method comprising the steps of:
   (a) providing first and second pairs of decoupling transistors; and
   (b) respectively coupling said first and second pairs of decoupling transistors in circuit with output nodes of said first and second CMOS inverters and first and second voltage supply terminals, such that decoupling transistors of said first pair of decoupling transistors have control electrodes thereof connected to a first common control node and decoupling transistors of said second pair of decoupling transistors have control electrodes thereof connected to a second common control node.

12. A method according to claim 11, wherein said first and second pairs of decoupling transistors comprise first and second pairs of complementary channel decoupling transistors, and further comprising the step of (c) biasing commonly connected gates of said first and second pairs of complementary channel decoupling transistors at complementary voltage levels.

13. A method according to claim 11, wherein said first and second pairs of decoupling transistors comprise first and second pairs of complementary channel decoupling transistors, and further comprising the step of (c) biasing commonly connected gates of said first and second pairs of complementary channel decoupling transistors at voltage levels complementary to the voltage levels stored by the CMOS inverters to which they are coupled.

14. A method according to claim 13, wherein step (c) comprises providing third and fourth CMOS inverters having respective input nodes and output nodes thereof cross-coupled to one another, and third and fourth pairs of decoupling transistors respectively provided in circuit with the output nodes of said third and fourth CMOS inverters and first and second voltage supply terminals, and coupling selected input nodes of said third and fourth CMOS inverters to gates of said second and first pairs of decoupling transistors.

15. A method of imparting single event upset immunity to a latch circuit that comprises a first inverter formed of a first complementary channel transistor pair having a first input node coupled to commonly connected gates thereof and a first output node coupled to commonly connected drains thereof, a second inverter formed of a second complementary channel transistor pair having a second input node coupled to commonly connected gates thereof and a second output node coupled to commonly connected drains thereof, and wherein said first input node is coupled to said second output node and said second input node is coupled to said first output node, said method comprising the steps of:
   (a) connecting a first pair of decoupling transistors respectively in circuit between source-drain paths of said first complementary channel transistor pair and first and second voltage supply terminals, such that decoupling transistors of said first pair of decoupling transistors have control electrodes thereof connected to a first common control node; and
   (b) connecting a second pair of decoupling transistors respectively in circuit between source-drain paths of said second complementary channel transistor pair and said first and second voltage supply terminals, such that decoupling transistors of said second pair of decoupling transistors have control electrodes thereof connected to a second common control node.

16. A method according to claim 15, further including the steps of:
   (c) providing a third inverter formed of a third complementary channel transistor pair having a third input node coupled to commonly connected gates thereof and a third output node coupled to commonly connected drains thereof, a fourth inverter formed of a fourth complementary channel transistor pair having a fourth input node coupled to commonly connected gates thereof and a fourth output node coupled to commonly connected drains thereof;
   (d) connecting a third pair of decoupling transistors respectively in circuit with source-drain paths of said third complementary channel transistor pair and said first and second voltage supply terminals, and a fourth pair of decoupling transistors respectively in circuit with source-drain paths of said fourth complementary channel transistor pair and said first and second voltage supply terminals; and
   (e) selectively coupling said third output node to commonly connected gates of said first pair of decoupling transistors and said fourth output node to commonly connected gates of said second pair of decoupling transistors.

17. A method according to claim 16, further including the step of coupling said first output node to commonly connected gates of said third pair of decoupling transistors and said second output node to commonly connected gates of said fourth pair of decoupling transistors.

18. A method according to claim 17, wherein said first pair of decoupling transistors comprises a first pair of complementary channel decoupling transistors having a p-channel transistor coupled to a p-channel transistor of said first inverter and an n-channel transistor coupled to an n-channel transistor of said first inverter, and wherein said second pair of decoupling transistors comprises a second pair of complementary channel decoupling transistors having a p-channel transistor complementary channel decoupling transistor coupled to a p-channel transistor of said second inverter and an n-channel transistor coupled to an n-channel transistor of said second inverter.

19. A method according to claim 18, wherein said third pair of decoupling transistors comprises a third pair of complementary channel decoupling transistors having a p-channel transistor coupled to a p-channel transistor of said third inverter and an n-channel transistor coupled to an n-channel transistor of said third inverter, and wherein said fourth pair of decoupling transistors comprises a fourth pair of complementary channel decoupling transistors having a p-channel transistor coupled to a p-channel transistor of said fourth inverter and an n-channel transistor coupled to an n-channel transistor of said fourth inverter.

* * * * *